US 11,921,553 B2

(12) United States Patent
Lee et al.

(10) Patent No.: US 11,921,553 B2
(45) Date of Patent: Mar. 5, 2024

(54) WEARABLE ELECTRONIC DEVICE HAVING HEAT DISSIPATION STRUCTURE

(71) Applicant: Samsung Electronics Co., Ltd., Gyeonggi-do (KR)

(72) Inventors: Jungkeun Lee, Gyeonggi-do (KR); Chunsik Choi, Gyeonggi-do (KR); Yonghee Jeung, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/980,721

(22) Filed: Nov. 4, 2022

(65) Prior Publication Data

US 2023/0059234 A1 Feb. 23, 2023

Related U.S. Application Data

(63) Continuation of application No. PCT/KR2021/003207, filed on Mar. 16, 2021.

(30) Foreign Application Priority Data

Jul. 16, 2020 (KR) .................. 10-2020-0087992

(51) Int. Cl.
*G06F 1/20* (2006.01)
*G02B 27/01* (2006.01)
*G06F 1/16* (2006.01)

(52) U.S. Cl.
CPC ......... *G06F 1/203* (2013.01); *G02B 27/0176* (2013.01); *G06F 1/163* (2013.01); *G06F 1/1692* (2013.01); *G02B 2027/0178* (2013.01)

(58) Field of Classification Search
CPC ........ G06F 1/203; G06F 1/163; G06F 1/1692; G02B 27/0176; G02B 2027/0178
See application file for complete search history.

(56) References Cited

U.S. PATENT DOCUMENTS

| 8,830,142 | B1 | 9/2014 | Kim et al. |
| 2007/0024801 | A1* | 2/2007 | Horiuchi ................... G02F 1/29 349/161 |
| 2015/0022773 | A1 | 1/2015 | Kim et al. |
| 2016/0187654 | A1* | 6/2016 | Border ............... G02B 27/0172 359/630 |
| 2018/0164606 | A1 | 6/2018 | Jung |
| 2019/0033619 | A1 | 1/2019 | Neitz et al. |
| 2020/0073450 | A1 | 3/2020 | Maric et al. |

(Continued)

FOREIGN PATENT DOCUMENTS

| JP | 2019-104110 A | 6/2019 |
| KR | 10-2015-0034448 A | 4/2015 |

(Continued)

*Primary Examiner* — Robert J Michaud
(74) *Attorney, Agent, or Firm* — Cha & Reiter, LLC

(57) ABSTRACT

According to an embodiment disclosed in the present document, an electronic device may include: a lens frame at least partially including a thermally conductive material; a pair of wearable members which can be rotatably coupled to the lens frame; at least one lens disposed in the lens frame; and transparent conductive lines disposed on the lens. The transparent conductive lines may be connected to the thermally conductive material of the lens frame to receive heat transferred from the lens frame. Other various embodiments are possible.

17 Claims, 9 Drawing Sheets

(56) References Cited

U.S. PATENT DOCUMENTS

2020/0225512 A1    7/2020    Maurice et al.
2021/0267100 A1*    8/2021    Yamada .............. H01M 10/653

FOREIGN PATENT DOCUMENTS

| KR | 10-2016-0034120 A | 3/2016 |
|----|-------------------|--------|
| KR | 10-2017-0072085 A | 6/2017 |
| KR | 10-2017-0110563 A | 10/2017 |
| KR | 10-2018-0058338 A | 6/2018 |
| KR | 10-2018-0065770 A | 6/2018 |
| KR | 10-2019-0010345 A | 1/2019 |
| KR | 102206570 B1 * | 1/2019 |
| KR | 10-2019-0049768 A | 5/2019 |
| KR | 10-2019-0094878 A | 8/2019 |
| KR | 10-2008294 B1 | 8/2019 |
| WO | 2016/118312 A1 | 7/2016 |

* cited by examiner

WEARABLE ELECTRONIC DEVICE HAVING HEAT DISSIPATION STRUCTURE

CROSS-REFERENCE TO RELATED APPLICATION(S)

This application is a continuation of International Application No. PCT/KR2021/003207, which was filed on Mar. 16, 2021, and claims priority to Korean Patent Application No. 10-2020-0087992, filed on Jul. 16, 2020, in the Korean Intellectual Property Office, the disclosure of which are incorporated by reference herein their entirety.

BACKGROUND

Technical Field

One or more embodiments disclosed herein relate to an electronic device, for example, a wearable electronic device including a heat dissipation structure.

Description of Related Art

With the development of electronic, information, and communication technologies, various functions have been integrated into a single portable electronic device. For example, an electronic device (e.g., smartphone) may be used as an audio player, an imaging device, or a digital diary, in addition to being a communication device, and various additional functions may be implemented in the smartphone through installation of applications. The electronic device may be provided with various pieces of information in real time from a server or another electronic device in wired or wireless manner as well as by executing an installed application or a stored function.

Since the use of electronic devices has become commonplace, user demands for portability and usability of electronic devices may increase. In response to such user demands, electronic devices capable of being worn on the user's body (hereinafter, referred to as "wearable electronic devices") like a wrist watch or glasses have been commercialized. One example of these wearable electronic devices is an electronic device that is wearable on the user's face, which may be used to implement virtual reality or augmented reality. For example, the wearable electronic device may implement virtual reality by providing three-dimensional images of a virtual space in a game, which in doing so may prevent the user from seeing his or her surroundings. Another type of wearable electronic device may implement augmented reality that provides various pieces of visual information to the user by displaying virtual images while providing an environment in which the user can still see his or her surroundings.

SUMMARY

As performance of electronic devices has advanced while being miniaturized or weight-reduced enough to provide a comfortable fit when worn on the user's body, a problem of heating is becoming increasingly prominent. Electrical components that generate heat during operation of the electronic device, such as integrated circuit chips and batteries, may be arranged in a relatively small space or close to each other. By rapidly diffusing or dissipating heat generated by the electrical components in the electronic device, it is possible to reduce the discomfort of the user who is wearing the electronic device or to prevent the user from getting a low-temperature burn. However, in an electronic device that is miniaturized enough to be worn on the user's body, there may not be enough room for a heat diffuser.

According to an embodiment disclosed herein, an electronic device may include a lens frame at least partially including a heat conductive material, a pair of wearing members configured to be rotatably coupled to the lens frame, at least one lens disposed in the lens frame, and a transparent conductive line disposed on the lens. The transparent conductive line may be configured to receive heat from the lens frame by being connected to the heat conductive material of the lens frame.

According to an embodiment disclosed herein, an electronic device may include a lens frame, a pair of wearing members rotatably coupled to the lens frame, at least one electrical component located in the pair of wearing members, a pair of lenses disposed in the lens frame, and a transparent conductive line disposed on the lenses. The pair of wearing members and the lens frame may be configured to transfer heat generated by the at least one electrical component to the transparent conductive line.

Additional aspects will be set forth in part in the description which follows and, in part, will be apparent from the description, or may be learned by practice of the presented embodiments.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Certain embodiments disclosed herein may provide an electronic device capable of rapidly diffusing or dissipating heat generated by at least one electrical component.

Certain embodiments disclosed herein may provide an electronic device capable of creating a comfortable wearing situation by rapidly diffusing or dissipating heat generated by at least one electrical component.

An electronic device according to certain embodiments disclosed herein is a pair of smart glasses, and is able to diffuse or dissipate heat generated from electrical components by using a transparent conductive line provided on a lens of the glasses. For example, the electronic device is able to facilitate the diffusion or dissipation of heat to a portion that does not come into contact with the user's body while the device is worn, thereby reducing or preventing heat transfer to the user's body. The electronic device according to certain embodiments disclosed herein is a pair of smart glasses, and enables an input module or an antenna module to be easily implemented even in a miniaturized electronic device by using a transparent conductive line formed on the lens as a touch panel or an antenna structure.

Figure 1:
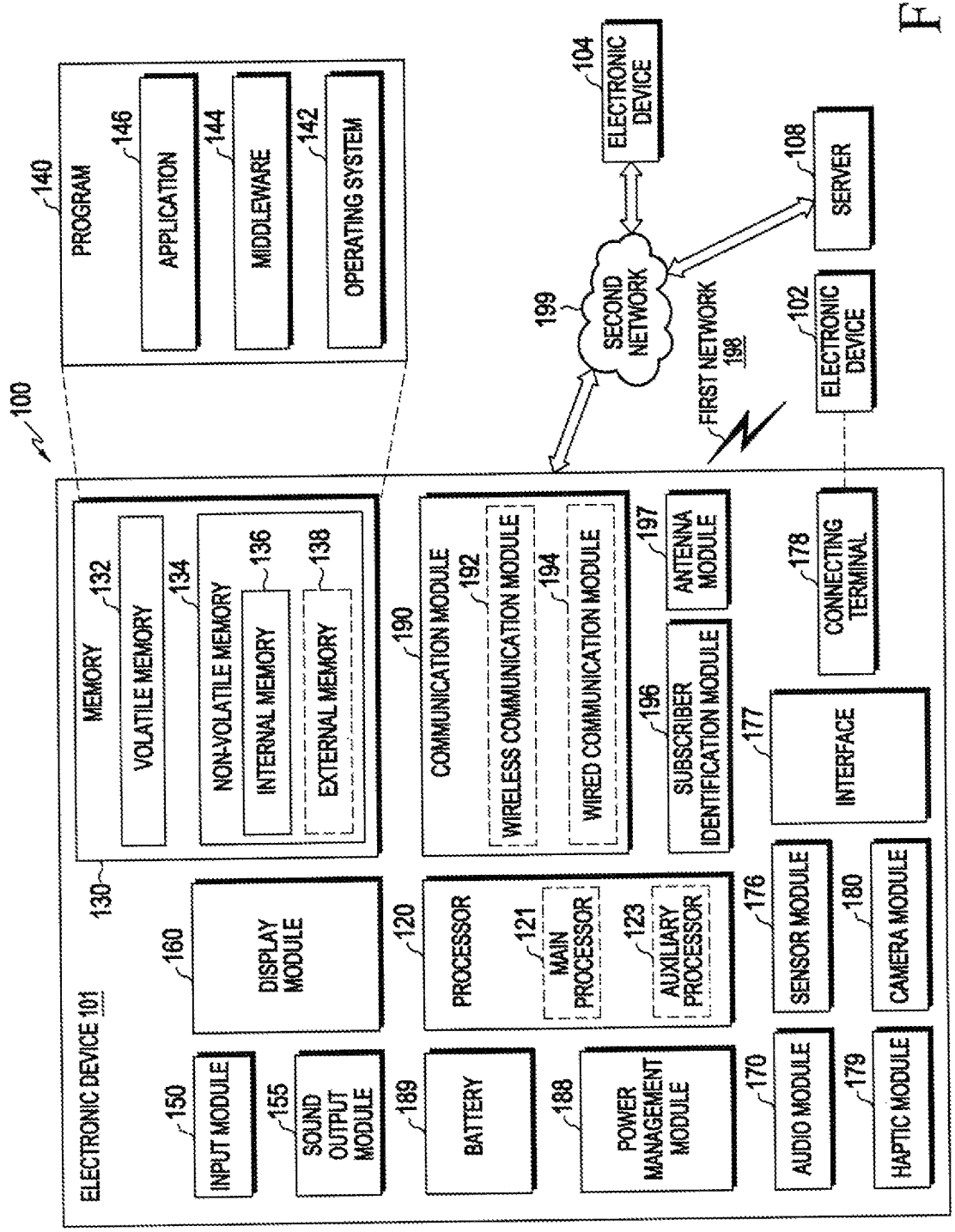
FIG. 1 is a block diagram of an electronic device according to various embodiments in a network environment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device and the external electronic device via the server coupled with the second network. Each of the external electronic devices may be a device of a same type as, or a different type, from the electronic device. According to an embodiment, all or some of operations to be executed at the electronic device may be executed at one or more of the external electronic devices. For example, if the electronic device should perform a function or a service automatically, or in response to a request from a user or another device, the electronic device, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device. The electronic device may provide the outcome, with or without further processing of the outcome, as at least part of a reply to the request. To that end, a cloud computing, distributed computing, mobile edge computing (MEC), or client-server computing technology may be used, for example. The electronic device may provide ultra low-latency services using, e.g., distributed computing or mobile edge computing. In another embodiment, the external electronic device may include an internet-of-things (IoT) device. The server may be an intelligent server using machine learning and/or a neural network. According to an embodiment, the external electronic device or the server may be included in the second network. The electronic device may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Figure 2:
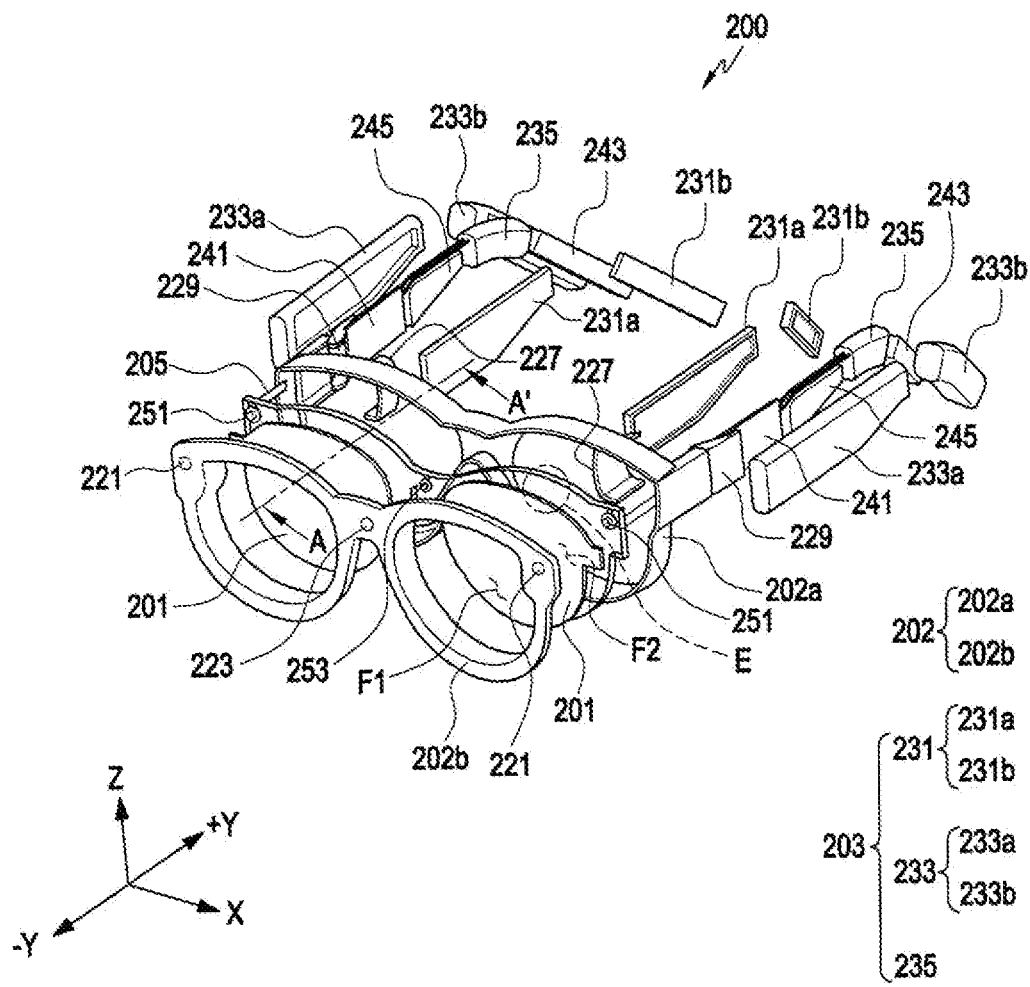
FIG. 2 is an exploded perspective view illustrating an electronic device according to one of various embodiments disclosed herein.
Figure 3A:
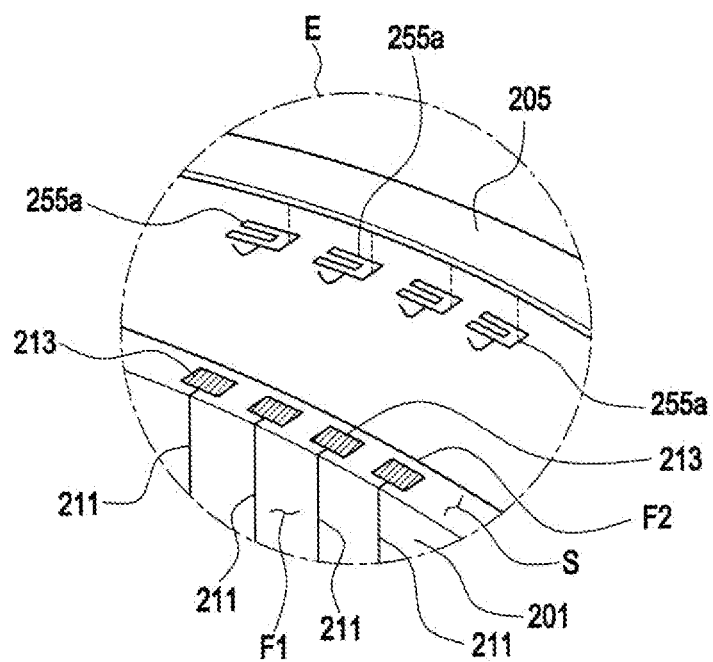
FIG. 3A is an enlarged view illustrating a portion E of FIG. 2.

FIG. 2 is an exploded perspective view illustrating an electronic device 200 (e.g., the electronic device 101 in FIG. 1) according to one of various embodiments disclosed herein. FIG. 3A is an enlarged view of a portion E of FIG. 2.

Referring to FIGS. 2 and 3A, the electronic device 200 is a pair of wearable glasses, and the user is able to visually recognize surrounding objects or environments even when wearing the electronic device 200. The electronic device 200 may acquire or recognize visual images regarding an object or environment in the direction in which the user gazes or the electronic device 200 is oriented (e.g., the −Y direction) using the camera module 251 (e.g., the camera module 180 in FIG. 1), and may receive information about an object or environment from an external electronic device (e.g., the electronic devices 102 and 104 or the server 108 in FIG. 1) via a network (e.g., the first network 198 or the second network 199 in FIG. 1). In another embodiment, the electronic device 200 may provide, to the user, the received information about the object or environment in an acoustic or visual form. For example, the electronic device 200 may provide the received information about the object or environment to the user via a lens 201 in a visual form by using a display module (e.g., the display module 160 in FIG. 1). The electronic device 200 may implement augmented reality by visually displaying the information about the object or environment and combining the same with the actual image of the object or environment surrounding the user. In the following detailed description, "a state or location in which an electronic device or a predetermined component of the electronic device faces the user's face" or similar may be stated, but it should be noted that in this state the user wears the electronic device 200.

According to an embodiment, the electronic device 200 may include at least one lens 201, a lens frame 202, a wearing member 203, and/or one or more transparent films and/or a transparent conductive lines 211, and the transparent film and/or the transparent conductive line 211 is made of, for example, a heat conductive material, and may be configured to receive heat transferred from at least a portion of the lens frame 202 by being disposed on the lens 201. In an embodiment, the transparent film and/or the transparent conductive line 211 may be configured to receive heat via the heat conductive material included in the lens frame 202. In another embodiment, a pair of lenses 201 may be provided and disposed to correspond to the user's left and light eyes, respectively, when the electronic device 200 is worn on the user's body. In some embodiments, the electronic device 200 may include one lens 201, and in this case, the lens 201 may be disposed to correspond to the user's left eye or right eye. In another embodiment, the electronic device 200 (e.g., in the form of goggles) may include a single lens 201 corresponding to both the left eye and the right eye.

According to an embodiment, the lens 201 include a first surface F1 oriented in a direction in which external light is incident (e.g., the −Y direction), a second surface F2 oriented in a direction opposite to the first surface F1 (e.g., the +Y direction), and a side surface S connecting the first surface F1 and the second surface F2. In the state in which the user wears the electronic device 200, the second surface F2 of the lens 201 may be disposed to face the user's left eye or right eye, and may allow light or an image incident through the first surface F1 to at least partially pass therethrough to enter the user's left eye or right eye. Although not illustrated, the lens 201 may include an optical waveguide structure, and may provide the user with images (e.g., images visually corresponding to information about a surrounding object or environment) output from the display module (e.g., the display module 160 in FIG. 1) by using the optical waveguide structure.

According to an embodiment, the one or more transparent conductive lines 211 may be provided on at least one of the first surface F1 and the second surface F2 of the lens 201. According to an embodiment, the one or more transparent conductive lines 211 may be located in a space between the first surface F1 and the second surface F2. For example, when the one or more transparent conductive lines 211 are located in the space between the first surface F1 and the second surface F2, some of the one or more transparent conductive lines 211 may be exposed to the outside of the lens 201 through at least one of the first surface F1 or the second surface F2. However, the disclosure is not limited thereto. As will be described with reference to FIG. 4, the transparent conductive line 211 may be formed on the film 301 provided separately from the lens 201, and the film 301 may be attached to the first surface F1 and/or the second surface F2 of the lens so that the transparent conductive line 211 may be disposed on the lens 201. In an embodiment, the transparent conductive line 211 may be made of material having good heat conductivity (e.g., graphene, silver (Ag), copper (Cu), gold (Au), indium (In), or tin (Sn)), and may be so thin that the transparent conductive line 211 is not recognized by the user's naked eye. Graphene may have heat conductivity of, for example, about 4800 to 5300 W/(m*K), and silver may have heat conductivity of, for example, 429 W/(m*K). The transparent conductive line 211 may include any one of the materials listed above, and may include a combination of two or more of the materials in some embodiments. For example, the transparent conductive line 211 may be made of silver or indium-tin oxide.

According to an embodiment, the electronic device 200 may include one or more transparent conductive lines 211. For example, the electronic device 200 may include a plurality of transparent conductive lines 211 arranged along the X direction while extending in the Z direction, as shown in FIG. 3A. In some embodiments, the electronic device 200 may include a plurality of transparent conductive lines 211 arranged in the Z direction while extending in the X direction. In another embodiment, the electronic device 200 may include a combination of the transparent conductive lines 211 extending in the Z direction and the transparent conductive lines 211 extending in the X direction. For example, when the lens 201 is viewed from the first surface F1 side and/or the second surface F2 side, the transparent conductive lines 211 may be arranged to form a mesh. As will be described later, one or more transparent conductive lines 211 may implement a heat dissipation structure, and may be configured to receive heat from the lens frame 202.

According to an embodiment, the transparent conductive lines 211 may have line width of about 4 micrometers or less, for example, about 2 micrometers, and as the number of one or more transparent conductive lines 211 increases (the distributed area of the conductive lines 211 increases), heat dissipation performance may be improved. Even if the transparent conductive lines 211 have sufficiently thin line width, when too many transparent conductive lines 211 are arranged, the light transmittance of the lens 201 may be lowered. For example, when the transparent conductive line 211 is formed in an excessively large area of the lens, visibility through the lens may be reduced. The line width or arrangement interval of the transparent conductive lines 211 may vary depending on the specifications of the electronic device 200 or the lens 201, and may be appropriately selected in consideration of the light transmittance or heat dissipation performance of the lens 201. According to an embodiment, the line width or arrangement interval of the one or more transparent conductive lines 211 located in the center of the lens 201 may be different from the line width or arrangement interval of the one or more transparent conductive lines 211 located in a peripheral portion of the lens 201 (e.g., the portion adjacent to the frame). For example, the line width of the one or more transparent conductive lines 211 located in the center of the lens 201 may be thinner than that of the one or more transparent conductive lines 211 located in the peripheral portion of the lens 201. In another example, the arrangement interval between the one or more transparent conductive lines 211 located in the center of the lens 201 may be greater than the arrangement interval between the one or more transparent conductive lines 211 located in the peripheral portion of the lens 201.

According to an embodiment, the electronic device 200 may include one or more contact pads 213 connected to the one or more transparent conductive lines 211 and one or more contact members 255a provided one the lens frame 202. The contact pads 213 and the contact members 255a may provide, for example, means for transferring heat from the lens frame 202 to the transparent conductive lines 211. The contact pads 213 may be provided on at least one of the first surface F1, the second surface F2, or the side surface S of the lens 201, and are made of substantially the same material as the transparent conductive lines 211. The positions at which the contact pads 213 are provided on the lens 201 may be appropriately selected depending on the assembly or mounting structure of the lens 201 and the lens frame 202. For example, the contact pads 213 may be provided or arranged generally along the edge of the first surface F1 or the second surface F2 of the lens 201, and may be provided on the side surface S of the lens 201 as in FIG. 3A in some embodiments.

According to an embodiment, the contact members 255a are elastic members such as C-clips or pogo pins, and may be provided on the lens frame 202 to come into contact with the contact pads 213. The contact members 255a may implement an electrical connection structure when coming into contact with the contact pads 213, and when the contact members 255a and/or the contact pads 213 include heat conductive material, the electrical connection structure may function as a heat transfer path. For example, the contact members 255a may be mounted on the lens frame 202 or the flexible printed circuit board 205 and may transfer heat to the contact pads 213. When mounted on the flexible printed circuit board 205, the contact members 255a, working in conjunction with the contact pads 213, may provide a path for electrically connecting the transparent conductive lines 211 to the flexible printed circuit board 205. In FIG. 3A, the contact members 255a are illustrated as being disposed on the flexible printed circuit board 205, but it is noted that the disclosure is not limited thereto. For example, some of the contact members 255a illustrated in FIG. 3A may be mounted on the flexible printed circuit board 205, and others may be mounted directly on the lens frame 202. In another embodiment, the contact members 255a may not be mounted on the flexible printed circuit board 205, but may be mounted on the lens frame 202.

According to an embodiment, the lens frame 202 is a structure for fixing at least one of the lenses 201, and may be supported or located on the user's face when the user wears the electronic device 200. For example, the lens frame 202 may position at least one of the lenses 201 to correspond to at least one of the user's eyes. In an embodiment, at least a portion of the lens frame 202 may include a material having good heat conductivity, for example, metal material. Heat conductive material may include, for example, metal material, but is not limited thereto. Any material having good heat conductivity may be used as the material for manufacturing the lens frame 202 even if the material is not metal. For example, graphene having heat conductivity of 4800 to 5300 W/(m*K) or aluminum having heat conductivity of 237 W/(m*K) may be used for at least a portion of the lens frame 202. The lens frame 202 substantially implements the external shape of the electronic device 200, and may be easily processed or molded by including not only the heat conductive metal material, but also polymer such as polycarbonate.

According to an embodiment, the lens frame 202 may include a first frame 202a disposed to face the user's face, and a second frame 202b coupled to face the first frame 202a. For example, when the user wears the electronic device 200, the user's face may be disposed on one side of the first frame 202a, and the second frame 202b may be disposed on the other side. For example, the second frame 202b may be disposed to be oriented in the user's viewing direction. In an embodiment, the edges of the lenses 201 may be at least partially located between the first frame 202a and the second frame 202b, and such that the first surfaces F1 and the second surfaces F2 are exposed to the external environment. For example, the first frame 202a and the second frame 202b may bind or fix the edge (e.g., the side surface) of at least one of lenses 201 while being coupled to face each other. In some embodiments, the lens frame 202 may have a shape that partially exposes the side surfaces S of the lenses 201 to the external environment, and in the illustrated embodiment, has a closed curve shape surrounding the lenses 201.

According to an embodiment, the electronic device 200 may include camera modules 251 (e.g., the camera module 180 in FIG. 1) and/or a sensor module 253 (e.g., the sensor module 176 in FIG. 1) disposed on the lens frame 202. The flexible printed circuit board 205 may electrically connect the camera modules 251 and/or the sensor module 253 to the circuit boards 241 accommodated in the wearing members 203. The camera modules 251 may acquire images of surrounding objects or environment through first optical holes 221 formed in the second frame 202b. The camera modules 251 and/or the first optical holes 221 may be disposed respectively at the opposite side ends of the lens frame 202 (e.g., the second frame 202b), for example, the opposite ends of the lens frame 202 (e.g., the second frame 202b) in the X direction. A processor (e.g., the processor 120 in FIG. 1) of the electronic device 200 may recognize the object or the environment based on the image acquired via the camera modules 251. In some embodiments, the electronic device 200 (e.g., the processor 120 or the communication module 190 in FIG. 1) may transmit the image acquired via the camera modules 251 to an external electronic device (e.g., the electronic device 102 or 104 or the server 108 in FIG. 1) to request information about the corresponding image.

According to an embodiment, the flexible printed circuit board 205 may extend from the circuit board 241 into the inside of the lens frame 202 across hinge structures 229, and may be disposed in in at least a portion of the peripheries of each of the lenses 201 within the lens frame 202. For example, the camera modules 251 and/or the sensor module 253 may be disposed substantially within the lens frame 202 and may be disposed around the lenses 201.

According to an embodiment, the sensor module 253 may include a proximity sensor, and may be electrically connected to the circuit boards 241 via the flexible printed circuit board 205. Through a second optical hole 223 provided in the second frame 202b, the sensor module 253 may detect whether or not the user's body (e.g., a finger) approaches the lens 201 or may detect whether or not the user's body remains close to the lens 201 within a certain distance. The sensor module 253 and/or the second optical hole 223 may be disposed in the central portion of the lens frame 202, for example, between the camera modules 251 in the X direction. In this embodiment, the electronic device 200 having one sensor module 253 (e.g., proximity sensor) and one second optical hole 223 is shown as an example, but the disclosure is not limited thereto. The number and/or positions of sensor modules 253 and second optical holes 223 may be variously changed in order to more accurately detect the approach or proximity state of the user's body.

According to an embodiment, the processor (e.g., the processor 120 in FIG. 1) may be configured to perform a predetermined function when the approach of the user's body is detected via the sensor module 253 (e.g., proximity sensor). In an embodiment, when one or more transparent conductive lines 211 are connected to the processor 120 or an input module (e.g., the input module 150 in FIG. 1) via the flexible printed circuit board 205, the function of detecting a touch input (e.g., touch, hovering input, or gesture input) by using the transparent conductive lines 211 may be activated when the approach of the user's body is detected via the proximity sensor. When the user's body is not detected for more than a predetermined length of time in the state in which the touch input detection function is activated, the processor 120 or the input module 150 may deactivate the touch input detection function. In some embodiments, when the approach of the user's body is detected, the processor 120 may store an image acquired via the camera modules 251. For example, depending on an operation mode of the electronic device 200, the processor 120 may execute various functions based on signals detected via a proximity sensor (e.g., the sensor module 253). In some embodiments, the sensor module 253 may include a visual line tracking sensor (not illustrated). For example, by including the gaze tracking sensor, the electronic device 200 may track the user's visual line (e.g. the direction of the user's gaze), and depending on the user's visual line, the electronic device 200 may adjust the position and/or the size of images output via a display module (e.g., the display module 160 in FIG. 1) and provided to the user via the lenses 201.

According to an embodiment, the electronic device 200 may include a pair of wearing members 203. The wearing members 203 each extend from the lens frame 202 and may be partially supported or located on the user's body (e.g., the ears) together with the lens frame 202. In an embodiment, the wearing members 203 may be rotatably coupled to the lens frame 202 via the hinge structures 229, and in the state in which the electronic device 200 is not worn, the user may conveniently carry or store the electronic device 200 by folding the wearing members 203 to overlap the lens frame 202. Portions of the hinge structures 229 may be mounted on the lens frame 202, and the other portions of the hinge structures 229 may be accommodated or mounted inside the wearing members 203, respectively. Hinge covers 227 may be mounted on the lens frame 202 to conceal portions of the hinge structures 229, respectively, and the other portions of the hinge structures 229 may be accommodated or concealed, respectively, between inner cases 231 and outer cases 233, which will be described later.

According to an embodiment, the electronic device 200 may include various electrical components located in the wearing members 203, for example, a processor (e.g., the processor 120 in FIG. 1), circuit boards 241, batteries 243, camera modules 251, a display module (e.g., the display module 160 in FIG. 1), and/or speaker modules 245. Various electronic components accommodated in the wearing members 203 may be electrically connected to each other via the circuit boards (e.g., the circuit boards 241), a flexible printed circuit board (e.g., the flexible printed circuit board 205), a conductive cable, or a connector. The positions of the electrical components in the wearing member 203 may be variously changed so that the weight of the electronic device 200 may be evenly distributed when the electronic device 200 is worn. For example, within the wearing members 203, the circuit boards 241 may be disposed adjacent to the lens frame 202, and electric components (e.g., the batteries 243) heavier than the circuit boards 241 may be disposed farther away from the lens frame 202 than the circuit boards 241. For example, it is possible to alleviate the concentration of the weight of the electronic device 200 to the lens frame 202 or on the user's face in the worn state. The speaker modules 245 may be disposed in the wearing members 203 between the circuit boards 241 and the batteries 245 to be located close to the user's ears, respectively, when the user wears the electronic device 200. In an embodiment, one or more integrated circuit chips (e.g., the integrated circuit chip 241a in FIG. 5) may be mounted on the circuit boards 241, and circuit devices such as the processor 120, the communication module 190, the power management module 188, or the memory 130 in FIG. 1 may be implemented by the integrated circuit chip 241a.

According to an embodiment, the one or more electrical components within the wearing members 203 (e.g., processor (e.g., the processor 120 of FIG. 1), the circuit boards 241, the integrated circuit chips 241a, the batteries 243, the camera modules 251, the display module (e.g., the display module 160 in FIG. 1) and/or the speaker modules 245) may generate heat while operating. According to an embodiment, the wearing members 203 may each include a heat conductive material capable of transferring heat generated from the electrical components to the lens frame 202. For example, the heat conductive material may include a heat pipe, graphite, or a heat sink. The lens frame 202 may transfer heat received via the heat conductive material, to the transparent conductive lines 211. According to an embodiment, the wearing members 203 may each at least partially include material capable of transferring heat (e.g., metal material), and the heat generated by one or more electrical components may be transferred the lens frame 202 via the wearing members 203. Heat generated by the one or more electrical components may be distributed to the wearing members 203, the heat conductive material included in the wearing members 203, the lens frame 202, and/or the transparent conductive lines 211. In an embodiment, when the electronic device 200 according to an embodiment disclosed herein operates while consuming about 400 mW of power, the maximum temperature at the points where the electrical components generating heat are disposed was measured as about 46 degrees Celsius and the temperature at the points where the first optical holes 221 are formed was measured as about 41 degrees Celsius. When an electronic device having the same configuration as the electronic device 200 except that the transparent conductive lines 211 are removed was operated while consuming about 400 mW of power, the maximum temperature at the points where the electrical components generating heat are disposed was measured as about 52 degrees Celsius, and the temperature at the points where the first optical holes 221 are formed was measured as about 48 degrees Celsius. However, the temperature of the lens not including the transparent conductive lines 211 was measured to be lower that the temperature of the lens that includes the transparent conductive lines 211. Through this, it can be seen that the generated heat is more rapidly diffused throughout the entire electronic device 200 by providing the lenses 201 with transparent conductive lines 211. It can be easily predicted that by diffusing the heat generated when consuming the same energy (e.g., power) over a larger area, the heat generated by the electronic device 200 according to certain embodiments disclosed herein can be more rapidly dissipated to the surroundings of the device.

According to an embodiment, the wearing members 203 may each include an inner case 231 and an outer case 233. The inner case 231 is, for example, a case configured to come into direct contact with the user's body, and may be made of a material having low heat conductivity (e.g., synthetic resin). The outer case 233 may include, for example, a material capable of at least partially transferring heat (e.g., metal material), and may be coupled to face the inner case 231. In an embodiment, the circuit boards 241 or the speaker modules 245 may be accommodated respectively in spaces separated from the batteries 243 within the wearing members 203. In the illustrated embodiment, the inner case 231 may include a first case 231a, which accommodates a circuit board 241 or a speaker module 245, and a second case 231b, which accommodates the battery 243, and the outer case 233 may include a third case 233a coupled to the first case 231a and a fourth case 233b coupled to the second case 231b. For example, the first case 231a and the third case 233a (hereinafter, "first case parts 231a and 233a") may be coupled to accommodate the circuit board 241 or the speaker module 245, and the second case 231b and the fourth case 233b (hereinafter, "second case parts 231b and 233b") may be coupled to accommodate the battery 243.

According to an embodiment, the first case parts 231a and 233a may be rotatably coupled to the lens frame 202 via the hinge structure 229, and the second case parts 231b and 233b may be connected to or mounted on the ends of the first case parts 231a and 233a via the connection member 235. In some embodiments, the portion of the connection member 235 that comes into contact with the user's body may be made of a material having low heat conductivity (e.g., elastic material such as silicone, polyurethane, or rubber), and the portion of the connection member 235 that does not come into contact with the user's body may be made of a material having high heat conductivity (e.g., metal material). For example, when heat is generated from the circuit boards 241 or the batteries 243, the connection members 235 may block heat from being transferred to the portions that come into contact with the user's body, and may diffuse or dissipate the heat through the portions that do not come into contact with the user's body. In some embodiments, the portions of the connection members 235 that are configured to come into contact with the user's body may be referred to as portions of the inner cases 231, and the portions of the connection members 235 that do not come into contact with the user's body may be referred to as portions of the outer cases 233.

According to an embodiment, at least some of the one or more transparent conductive lines 211 may be electrically connected to the circuit boards 241 via the contact pads 213, the contact members 255a, and/or the flexible printed circuit board 205. When the transparent conductive lines 211 are electrically connected to the circuit boards 241 via the flexible printed circuit board 205, the heat generated by the electrical components, such as the circuit boards 241, the integrated circuit chips 241a, the camera modules 251, the display module (e.g., the display module 160 in FIG. 1), and or the batteries 243, may be transferred to the transparent conductive lines 211 via the flexible printed circuit board 205. For example, the flexible printed circuit board 205 as well as the wearing members 203 or the lens frame 202 may transfer heat generated by the electrical components to the transparent conductive lines 211.

According to an embodiment, as described above, when the transparent conductive lines 211 are electrically connected to the circuit boards 241, the processor (e.g., the processor 120 in FIG. 1) may be configured to detect the user's touch input by using at least some of the transparent conductive lines 211. The "touch input" may include, for example, a direct contact of the lenses 201 by the user's body, hovering within a predetermined distance from the lenses 201, or a gesture made within a predetermined distance from the lenses 201. In the operation of detecting the touch input via the transparent conductive lines 211, the sensor module 253 (e.g., proximity sensor) may be utilized to activate or deactivate a touch input function. In another embodiment, the input module (e.g., the input module 150 in FIG. 1) or the processor 120 may include a touch panel controller, and the touch input function may be performed by the touch panel controller.

According to an embodiment, when the transparent conductive lines 211 are electrically connected to the circuit boards 241, the processor 120 or the power management module (e.g., the power management module 188 in FIG. 1) may be configured to wirelessly receive power from an external device by using at least some of the transparent conductive lines 211. The processor 120 or the power management module 188 may operate the electronic device 200 or charge the batteries 243 by using the received power.

Figure 3B:
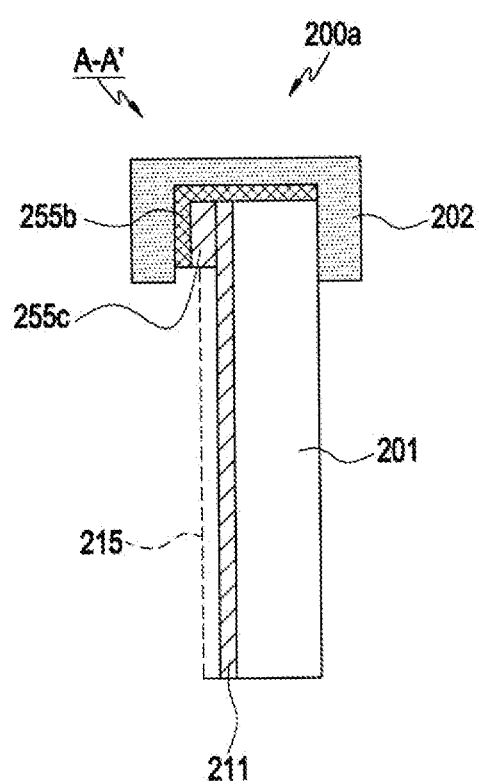
FIG. 3B is a cross-sectional view illustrating the configuration of an electronic device according to another one of various embodiments disclosed herein.

FIG. 3B is a view illustrating a cross-sectional configuration of an electronic device 200a (e.g., the electronic device 200 of FIG. 2) according to another one of various embodiments disclosed herein.

FIG. 3B is a view illustrating, for example, a cross-sectional configuration taken along line A-A' of FIG. 2. Referring to FIG. 3B, a lens frame 202 may include a heat transfer material or heat transfer structure 255b provided therein. The heat transfer structure 255b may include, for example, metal material having good heat conductivity, a heat pipe, graphite, and/or a heat sink, and may be concealed from the outside by a polymer. For example, the heat transfer structure 255b may be disposed to be at least partially in contact with the lens 201. In an embodiment, the one or more transparent conductive lines 211 may be disposed to be in contact with the heat transfer structure 255b to receive heat. In some embodiments, a heat transfer material (thermal interface material) 255c may be provided between the heat transfer structure 255b and the transparent conductive line 211. For example, the heat transfer material 255c may be a heat conductive double-sided tape, and may transfer heat from the heat transfer structure 255b to the transparent conductive lines 211.

According to an embodiment, the transparent conductive lines 211 may be protected by an optically transparent film 215. When the transparent conductive lines 211 are protected by the film 215, portions of the transparent conductive lines 211 (e.g., the portions corresponding to the heat transfer structure 255b and/or the heat transfer material 255c) may be exposed by the film 215. For example, the transparent conductive lines 211 may be disposed to be in direct contact with the heat transfer structure 255b and/or the heat transfer material 255c through the portion exposed by the film 215.

Figure 4:
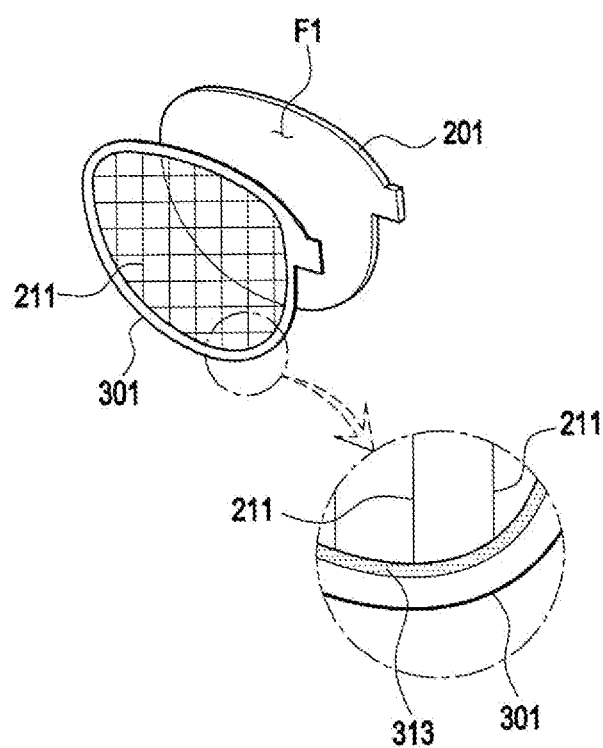
FIG. 4 is a view for describing an arrangement structure of a transparent conductive line of an electronic device according to another one of various embodiments disclosed herein.

FIG. 4 is a view for describing an arrangement structure of transparent conductive lines of an electronic device (e.g., the electronic device 200 in FIG. 2) according to another one of various embodiments disclosed herein.

Referring to FIG. 4, the electronic device 200 may further include a film 301 attached to the first surface F1 and/or the second surface F2 of the lens 201, and the conductive lines 211 may be provided on the surface of the film 301. The film 301 may be made of, for example, polymer material such as polyethylene terephthalate (PET). In attaching the film 301 to the lens 201, an optical clear adhesive may be used. In the illustrated embodiment, the configuration in which the film 301 is attached to the first surface F1 of the lens 201 is shown as an example, but the disclosure is not limited thereto. The film 301 may be attached to the second surface F2 or may be attached to both the surface F1 and the second surface F2. According to an embodiment, when the transparent conductive lines 211 are provided on the film 301, a contact pad 313 may be provided at the ends of the transparent conductive lines 211 at the edge of the surface of the film 301 (e.g., around the lens frame 202). In some embodiments, the contact pad 313 may be provided to form a closed curve substantially along the edge of the film 301.

Figure 5:
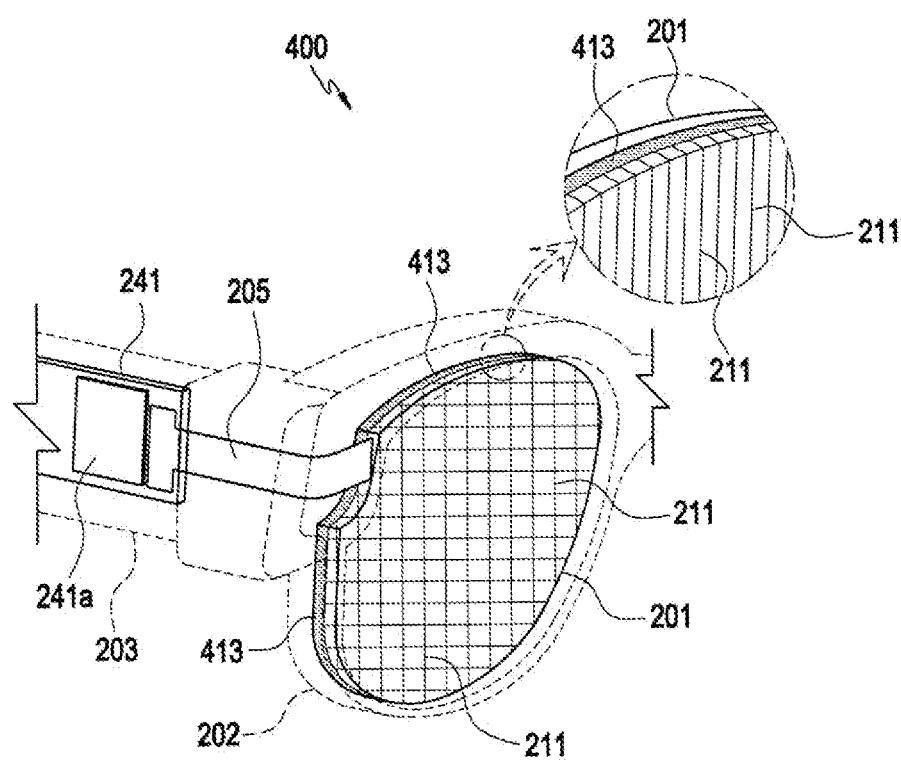
FIG. 5 is a view illustrating a part of an electronic device according to still another one of various embodiments disclosed herein.

FIG. 5 is a view illustrating a part of an electronic device 400 (e.g., the electronic device 200 in FIG. 2) according to another one of various embodiments disclosed herein.

Referring to FIG. 5, when the lens 201 is positioned in the lens frame 202, the side surface of the lens 201 (e.g., the side surface S in FIG. 3A) may be in at least partial contact with the lens frame 202 so that heat can be transferred from the lens frame 202 to the transparent conductive lines 211. The transparent conductive lines 211 may extend from the first surface F1 and/or the second surface F2 of the lens 201 such that one ends thereof are located on the side surface S of the lens 201. A heat conductive adhesive 413 may be provided on the side surface S of the lens 201 to transfer heat from the lens frame 202 to the transparent conductive lines 211 while fixing the lens 201 to the lens frame 202. In some embodiments, when the heat conductive adhesive 413 is provided, the contact pads 213 and/or the contact members 255a may be omitted. For example, the contact pads 213 and/or the contact members 255a of FIG. 3A may be replaced with the heat conductive adhesive 413. As described above, the structure for transferring heat from the lens frame 202 to the transparent conductive lines 211 may be implemented in various different ways. In addition to this, a heat fusion structure or a zero-insertion force (ZIF) connector may be provided as the heat transfer structure between the lens frame 202 and the transparent conductive lines 211, or may be provided as the electrical connection structure between the flexible printed circuit board 205 and the transparent conductive lines 211.

Figure 6:
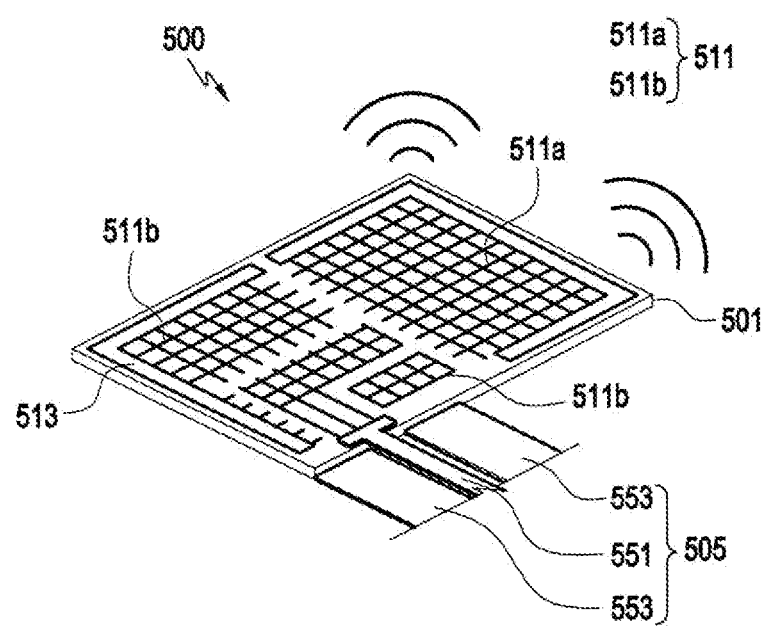
FIG. 6 is a view for describing an example in which transparent conductive lines are implemented as an antenna in an electronic device according to an embodiment disclosed herein.

FIG. 6 is a view for describing an example in which transparent conductive lines (e.g., the transparent conductive lines 211 in FIG. 3A) are implemented as an antenna 500 (e.g., the antenna module 197 in FIG. 1) in an electronic device (e.g., the electronic device 101, 200, or 400 of FIGS. 1, FIG. 2, or FIG. 5) according to an embodiment disclosed herein.

Referring to FIG. 6, an antenna 500 may include transparent conductive lines 511 (e.g., the transparent conductive lines 211 in FIGS. 2 to 5) provided on a substrate 501, and the transparent conductive lines 511 may be arranged substantially in the form of a mesh. The substrate 501 may be made of, for example, a material that is capable of transmitting light (e.g., glass or synthetic resin), and may form at least a portion of a lens (e.g., the lens 201 of FIG. 2 or FIG. 4). At least some of the transparent conductive lines 511 may include a radiation part 511a connected to the transmission line 551 and a ground part 511b electrically isolated from the radiation part 511a, and may at least partially connected to a contact pad 513 (e.g., the contact pads 213 and 313 of FIG. 3A or FIG. 4). In an embodiment, the contact pad 513 may be disposed to receive heat from the lens frame (e.g., the lens frame 202 in FIG. 2). For example, when the substrate 501 forms a portion of the lens 201 and is located in the lens frame 202, the contact pad 513 may be brought into direct contact with the lens frame 202 or may be attached to the lens frame 202 via an adhesive member such as a heat conductive adhesive (e.g., the heat conductive adhesive in FIG. 5). For example, the contact pad 513 may be electrically connected to the lens frame 202.

According to an embodiment, a wiring part 505 may be electrically or mechanically coupled to the substrate. In an embodiment, the wiring part 505 may include a transmission line 551 and a ground conductor 553. The transmission line 551 may be electrically connected to a processor (e.g., the processor 120 in FIG. 1) or a communication module (e.g., the communication module 190 in FIG. 1) and may be provide a feeding signal to radiation portions 511a of the transparent conductive lines 511. For example, the processor 120 or the communication module 190 may perform wireless communication by using at least some of the transparent conductive lines 511 (e.g., the radiation portions 511a). In an embodiment, the processor 120 or the communication module 190 may perform Bluetooth or GPS communication by using the transparent conductive lines 511. In this way, the transparent conductive lines 511 may be utilized as at least a part of the antenna 500 while providing heat dissipation for the electronic device (e.g., the electronic device 200 in FIG. 2). For example, the electronic device 200 may perform wireless communication with an external electronic device (e.g., the electronic device 102 or 104 or a server 108 in FIG. 1) by using the transparent conductive lines 511 (e.g., the transparent conductive lines 211 in FIG. 3A). This way, additional internal space in the electronic device for accommodating a separate antenna may not be necessary.

According to an embodiment, the ground conductor 553 may prevent loss or distortion of the signal transmitted between the processor 120 or the communication module 190 and the radiation portions 511a by providing an electromagnetic shield environment to the transmission line 551. The wiring part 505 may be provided in a portion of the flexible printed circuit board 205 in FIG. 2, or may be made of a coaxial cable provided separately from the flexible printed circuit board 205.

Figure 7:
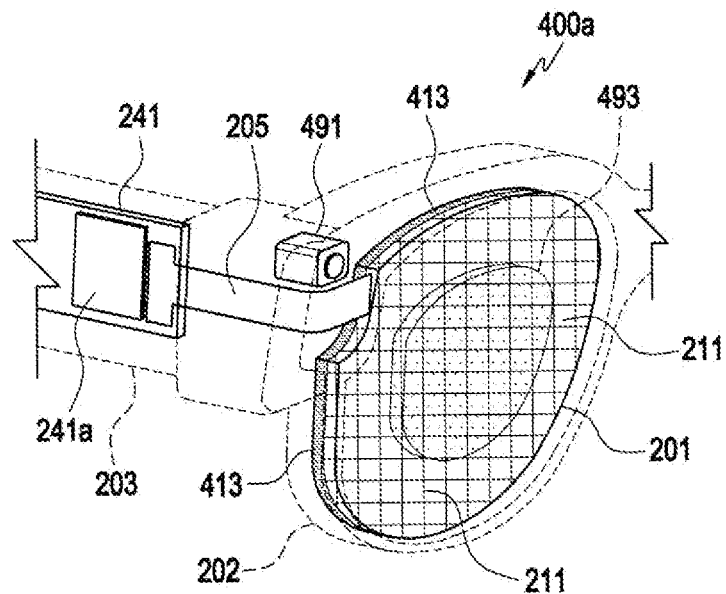
FIG. 7 is a view illustrating a part of an electronic device according to another one of various embodiments disclosed herein.

FIG. 7 is a view illustrating a part of an electronic device 400a (e.g., the electronic device 200 in FIG. 2) according to another one of various embodiments disclosed herein.

Referring to FIG. 7, the electronic device 400a may include a display module 491 (e.g., the display module 160 in FIG. 1) and an optical waveguide 493. In an embodiment, the display module 491 may be an optical projector, and may provide visual information to the user through the optical waveguide 493 built in the lens 201. According to an embodiment, when implemented as an optical projector, the display module 491 may include a projection lens. The projection lens may be a condensing lens configured to condense display light emitted from the light source of the display module 491, and may be disposed to guide the display light to the optical waveguide 493 built in the lens 201.

According to an embodiment, the optical waveguide 493 may be made of glass or polymer, and may include nanopatterns formed on one surface of the inside and/or outside thereof, for example, a polygonal and/or curved grating structure. In an embodiment, light incident into the optical waveguide 493 may be propagated inside the optical waveguide 493 by the nanopatterns and provided to the user. In another embodiment, the optical waveguide 493 may be substantially transparent to the user's naked eye, and may transmit and provide light reflected from the actual surrounding environment of the user to the user. In some embodiments, the transparent conductive lines 211 may be provided in a region that does not substantially overlap the optical waveguide 493. In another embodiment, the line width of the transparent conductive lines 211 may be different in the region overlapping the optical waveguide 493 and the region not overlapping the optical waveguide 493. For example, the line width of the transparent conductive lines 211 in the area overlapping the optical waveguide 493 may be smaller than the line width of the transparent conducting lines 211 in the area not overlapping the optical waveguide 493.

Although not illustrated, the electronic device 400a may include a heat conductive member (e.g., heat pipe, graphite, or heat sink) configured to transfer heat generated from the display module 491. For example, the heat conductive member may transfer heat generated from the display module 491 to the transparent conductive lines 211 via the lens frame 202.

Figure 8:
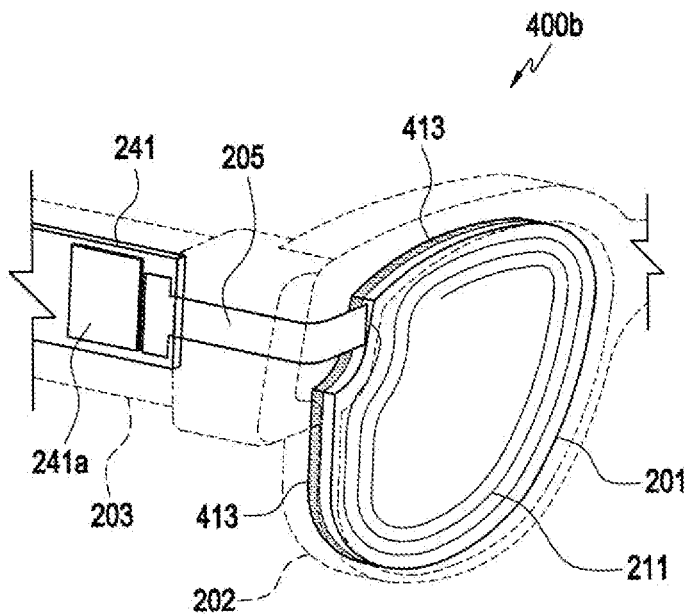
FIG. 8 is a view illustrating a part of an electronic device according to another one of various embodiments disclosed herein.

FIG. 8 is a view illustrating a part of an electronic device 400b (e.g., the electronic device 200 in FIG. 2) according to another one of various embodiments disclosed herein.

Referring to FIG. 8, the transparent conductive lines 211 may be provided in a loop or spiral shape on the lens 201. In an embodiment, the electronic device 400b may wirelessly receive power from an external electronic device (e.g., wireless charger) via the transparent conductive lines 211 having the loop or spiral shape. In an embodiment, the transparent conductive lines 211 may be electrically connected to a charging circuit (e.g., the power management module 188 in FIG. 1), and the electronic device 400b may operate based on the power received via the transparent conductive lines 211 or may charge a battery (e.g., the batteries 189 and 243 of FIG. 1 or FIG. 2) by using the power.

According to an embodiment, some of the transparent conductive lines 211 provided on the lens 201 may function as an antenna (e.g., the antenna 500 in FIG. 6), another part of the transparent conductive lines 211 may implement a heat dissipation structure, and/or still another part of the transparent conductive lines 211 may be utilized to detect touch inputs. In an embodiment, the part of the transparent conductive lines 211 that functions as the antenna may be electrically separated from the heat dissipation structure or the part utilized to detect touch inputs. In some embodiments, the part of the transparent conductive line 211 that functions as the antenna may be provided as the heat dissipation structure. In another embodiment, the part of the transparent conductive lines 211 that is utilized to detect touch inputs may be electrically separated from the part functioning as the antenna, and may provide heat dissipation according to an embodiment.

According to an embodiment, depending on the function provided by the transparent conductive lines 211, a charging circuit (e.g., the power management module 188 in FIG. 1), a communication module (e.g., the communication module 190 in FIG. 1) or an input module (e.g., the input module 150 in FIG. 1) may be electrically connected to the transparent conductive lines 211. In another embodiment, the transparent conductive lines 211 may function as heat dissipation structure, and when provided as the heat dissipation structure, the transparent conductive lines 211 may receive heat from the lens frame 202 and dissipate the heat to the outside of the device.

Figure 9:
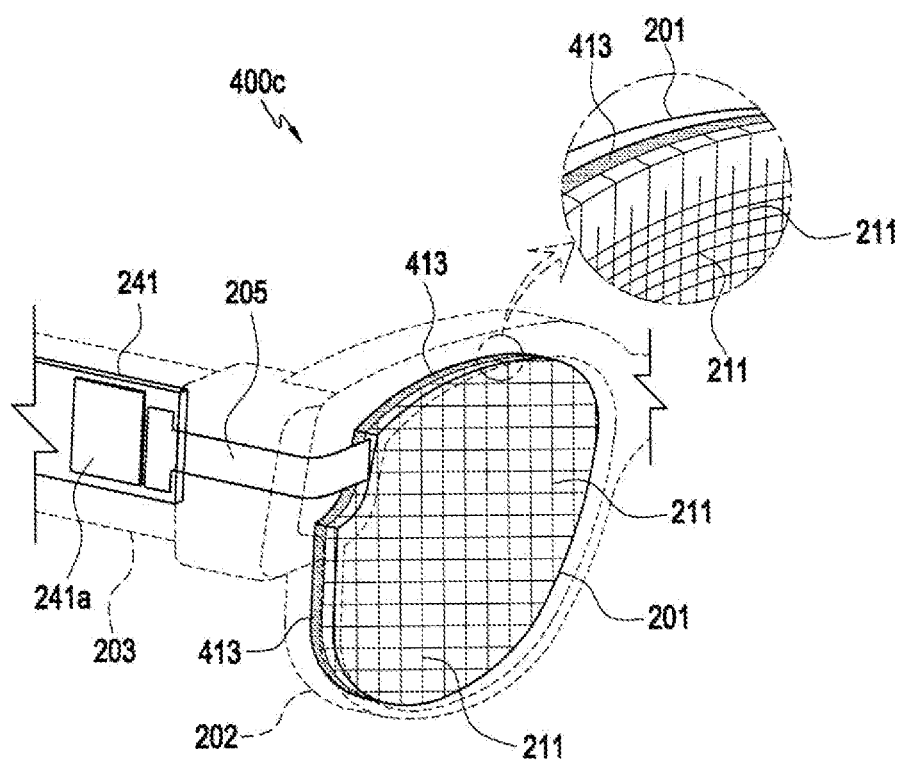
FIG. 9 is a view illustrating a part of an electronic device according to still another one of various embodiments disclosed herein.

FIG. 9 is a view illustrating a part of an electronic device 400c (e.g., the electronic device 200 in FIG. 2) according to another one of various embodiments disclosed herein.

Referring to FIG. 9, when a plurality of transparent conductive lines 211 are provided, at the edge of the lens 201, some of the transparent conductive lines 211 may not be directly connected to a contact member (e.g., the contact member 255a in FIG. 3A or the heat conductive adhesive 413 in FIG. 5). For example, some of the transparent conductive lines 211 extending in the longitudinal direction in FIG. 9 may not be directly connected to a contact member (e.g., the contact member 255a in FIG. 3A or the heat conductive adhesive 413 in FIG. 5). According to an embodiment, the transparent conductive lines 211, which are not directly connected with the contact member (e.g., the contact member 255a of FIG. 3A or the heat conductive adhesive 413 of FIG. 5), may intersect or connect with other transparent conductive lines 211 provided on the lens 201 to diffuse or dissipate the heat transferred from the lens frame 202 to the outside of the device.

As described above, according to an embodiment disclosed herein, an electronic device (e.g., the electronic device 101, 200, or 400 in FIGS. 1, FIG. 2, or FIG. 5) may include a lens frame (e.g., the lens frame 202 in FIG. 2) at least partially including a heat conductive material, a pair of wearing members (e.g., the wearing members 203 in FIG. 2) rotatably coupled to the lens frame, at least one lens (e.g., the lenses 201 in FIG. 2) disposed in the lens frame, and a transparent conductive line (e.g., the transparent conductive lines 211 in FIG. 3A) disposed on the lens, wherein the transparent conductive line may be configured to receive heat from the lens frame by being connected to the heat conductive material of the lens frame.

According to an embodiment, the electronic device described above may further include a processor (e.g., the processor 120 in FIG. 1), wherein the processor may be configured to detect a user's touch input via the transparent conductive line.

According to an embodiment, the electronic device described above may further include a processor (e.g., the processor 120 in FIG. 1) and a proximity sensor (e.g., the sensor module 176 or 253 in FIG. 1 or FIG. 2), wherein the processor may be configured to detect whether a user's body is in proximity to the electronic device by using the proximity sensor and detect a touch input, a hovering input, or a gesture performed by the user by using the transparent conductive line when the proximity of the user's body is detected.

According to an embodiment, the electronic device described above may further include a processor (e.g., the processor 120 in FIG. 1) or a communication module (e.g., the communication module 190 in FIG. 1), wherein the processor or the communication module may be configured to perform wireless communication by using the transparent conductive line.

According to an embodiment, the electronic device described above may further include a power management module (e.g., the power management module 188 in FIG. 1), wherein the power management module may be configured to receive wirelessly charging power by using the transparent conductive line.

According to an embodiment, the pair of wearing members may each include an inner case (e.g., the inner case 231 in FIG. 2) configured to come into contact with the user's body while the electronic device is worn by the user, and an outer case (e.g., the outer case 233 in FIG. 2) coupled with the inner case, wherein the outer case may at least partially include a heat conductive material, and the heat conductive material of the outer case may be configured to transfer heat to the heat conductive material of the lens frame.

According to an embodiment, the electronic device described above may include a circuit board (e.g., the circuit boards 241 in FIG. 2) disposed inside the pair of wearing members, and a speaker module (e.g., the speaker modules 245 in FIG. 2) or a battery (e.g., the batteries 243 in FIG. 2), wherein the heat conductive material of the outer case may be configured to transfer the heat generated by the circuit board, the speaker module, or the battery to the heat conductive material of the lens frame.

According to an embodiment, the lens may include a first surface (e.g., the first surface F1 in FIG. 3A) disposed to face the user's eye, and a second surface (e.g., the second surface F2 in FIG. 3A) facing away from the user's eyes, and a side surface (e.g., the side surface S in FIG. 3A) connecting the first surface and the second surface, wherein the transparent conductive line may be provided on at least one of the first surface or the second surface.

According to an embodiment, the electronic device described above may further include a contact pad (e.g., the contact pads 213, 313, or 513 in FIG. 3A, FIG. 4, or FIG. 6) provided on at least one of the first surface, the second surface, or the side surface, and a contact member (e.g., the contact members 255a of FIG. 3A or the heat conductive adhesive 413 in FIG. 5) provided on the lens frame, wherein the contact member and the contact pad may be configured to transfer heat from the lens frame to the transparent conductive line.

According to an embodiment, the lens includes a first surface disposed to face the user's eyes, a second surface facing away from the user's eyes, and a side surface connecting the first surface and the second surface, and the transparent conductive line may be included in a film (e.g., the film 301 in FIG. 4) attached to at least one of the first surface or the second surface.

According to an embodiment disclosed herein, an electronic device may include a lens frame (e.g., the lens frame 202 of FIG. 2), a pair of wearing members (e.g., the wearing members 203 in FIG. 2) rotatably coupled to the lens frame, at least one electrical component (e.g., a processor (e.g., the processor 120 in FIG. 1), the circuit boards 241, the integrated chip 241a, the batteries 243, the camera module 251, a display module (e.g., the display module 160 in FIG. 1), and/or the speaker modules 245) disposed in the pair of wearing members, a pair of lenses (e.g., the lenses 201 in FIG. 2) disposed in the lens frame, and a transparent conductive line (e.g., the transparent conductive lines 211 in FIG. 3A) positioned on the lens, wherein the wearing member and the lens frame may be configured to transfer heat generated by the at least one electrical component to the transparent conductive line.

According to an embodiment, the pair of wearing members may each include an inner case (e.g., the inner case 231 in FIG. 2) configured to come into contact with the user's body while the electronic device is worn by the user, and an outer case (e.g., the outer case 233 in FIG. 2) coupled with the inner case, wherein the outer case may be configured to at least partially absorb the heat generated by the at least one electrical component and transfer the heat to the lens frame.

According to an embodiment, the at least one electrical component may include a circuit board (e.g., the circuit boards 241 of FIG. 2) disposed adjacent to the lens frames within the pair of wearing members, a battery (e.g., the batteries 243 in FIG. 2) disposed within the pair of wearing members farther from the lens frame than the circuit board, and a speaker module (e.g., the speaker modules 245 in FIG. 2) at least partially disposed between the circuit board and the battery within the pair of wearing members.

According to an embodiment, the electronic device described above may further include a flexible printed circuit board (e.g., the flexible printed circuit board 205 in FIG. 2) extending from the circuit board, wherein the flexible printed circuit board may be at least partially disposed inside the lens frame and may be electrically connected to the transparent conductive line.

According to an embodiment, the flexible printed circuit board may be disposed on at least a portion of the periphery of the lens.

According to an embodiment, the contact member may include a heat conductive adhesive or a C-clip.

According to an embodiment, the transparent conductive line may include any one or a combination of two or more of silver (Ag), gold (Au), copper (Cu), indium (In), or tin (Sn).

In the foregoing detailed description, specific embodiments have been described, but it will be evident to a person ordinarily skilled in the art that various modifications can be made without departing from the scope of the disclosure.

What is claimed is:

1. An electronic device comprising:
 a lens frame at least partially comprising a heat conductive material;
 a pair of wearing members configured to be rotatably coupled to the lens frame;
 at least one lens disposed in the lens frame, wherein the heat conductive material of the lens frame is in direct contact with the at least one lens; and
 transparent conductive lines disposed on a front or a rear surface of the at least one lens, the transparent conductive lines i-s-configured to receive and dissipate heat from the lens frame by being connected to the heat conductive material of the lens frame.

2. The electronic device of claim 1, further comprising a processor,
 wherein the processor is configured to detect a user's touch input of the transparent conductive lines, while the transparent conductive lines dissipate heat.

3. The electronic device of claim 1, further comprising:
 a processor; and
 a proximity sensor,
 wherein the processor is configured to detect whether a user's body is in proximity to the electronic device by using the proximity sensor and detect a touch input, a hovering input, or a gesture performed by the user by using the transparent conductive lines when the proximity of the user's body is detected.

4. The electronic device of claim 1, further comprising a processor or a communication module,
 Wherein the processor or the communication module is configured to perform wireless communication using the transparent conductive lines as an antenna, while the transparent conductive lines dissipate heat.

5. The electronic device of claim 1, further comprising a power management module,
 wherein the power management module is configured to wirelessly receive charging power by using the transparent conductive lines, while the transparent conductive lines are dissipating heat.

6. The electronic device of claim 1, further comprising at least one electrical component disposed in the pair of wearing members,
 wherein the pair of wearing members and the lens frame are configured to transfer heat generated by the at least one electrical component to the transparent conductive lines.

7. The electronic device of claim 6, wherein each of the pair of wearing members further comprises:
 an inner case configured to come into contact a user's body while the electronic device is worn by the user; and
 an outer case coupled to the inner case,
 wherein the outer case is configured to at least partially absorb the heat generated by the at least one electrical component and transfer the heat to the lens frame.

8. The electronic device of claim 6, wherein the at least one electrical component further comprises:
 a circuit board disposed within the pair of wearing members to be adjacent to the lens frame;
 a battery disposed within the pair of wearing members farther from the lens frame than the circuit board; and
 a speaker module at least partially disposed between the circuit board and the battery within the pair of wearing members.

9. The electronic device of claim 8, further comprising a flexible printed circuit board extending from the circuit board,
wherein the flexible printed circuit board is at least partially disposed inside the lens frame and is electrically connected to the transparent conductive lines.

10. The electronic device of claim 9, wherein the flexible printed circuit board is disposed on at least a portion of a periphery of the at least one lens.

11. The electronic device of claim 1, further comprising:
a contact pad provided on the front surface, the rear surface, and/or a side surface; and
a contact member provided on the lens frame,
wherein the contact member and the contact pad are configured to transfer the heat from the lens frame to the transparent conductive lines.

12. The electronic device of claim 11, wherein to transfer the heat from the lens frame to the transparent conductive lines, the contact member and the contact pad are in physical contact with each other.

13. The electronic device of claim 11, wherein the contact member further comprises a heat conductive adhesive or a C-clip.

14. The electronic device of claim 6, wherein the transparent conductive lines further comprises any one or a combination of two or more of graphene, silver (Ag), copper (Cu), gold (Au), indium (In), or tin (Sn).

15. The electronic device of claim 1, wherein the transparent conductive lines further comprises:
first transparent conductive line disposed in a first direction; and
second transparent conductive line disposed in a second direction substantially orthogonal to the first direction, such that the first transparent conductive line and the second transparent conductive line form a mesh.

16. The electronic device of claim 1, further comprising a processor or a communication module,
wherein the processor or the communication module is configured to perform wireless communication by using the transparent conductive lines as an antenna, while the transparent conductive lines dissipate heat, and
wherein the transparent conductive lines further comprises:
first transparent conductive line electrically connected to the processor or the communication module; and
second transparent conductive line electrically isolated from the first transparent conductive line.

17. The electronic device of claim 1, wherein the transparent conductive lines further comprises:
first transparent conductive line disposed in a center of the at least one lens and having a first line width; and
second transparent conductive line disposed in a periphery of the at least one lens and having a second line width,
wherein the second line width is greater than the first line width.

* * * * *